United States Patent
Bueb et al.

(10) Patent No.: US 8,504,893 B1
(45) Date of Patent: Aug. 6, 2013

(54) ERROR DETECTION OR CORRECTION OF A PORTION OF A CODEWORD IN A MEMORY DEVICE

(75) Inventors: Christopher Bueb, Folsom, CA (US); Sean Eilert, Penryn, CA (US)

(73) Assignee: Micron Technology, Inc., Boise, ID (US)

( * ) Notice: Subject to any disclaimer, the term of this patent is extended or adjusted under 35 U.S.C. 154(b) by 232 days.

(21) Appl. No.: 12/894,920

(22) Filed: Sep. 30, 2010

(51) Int. Cl.
*H03M 13/00* (2006.01)

(52) U.S. Cl.
USPC .......................................................... 714/758

(58) Field of Classification Search
USPC .......................................................... 714/758
See application file for complete search history.

(56) References Cited

U.S. PATENT DOCUMENTS

| | | | | |
|---|---|---|---|---|
| 5,581,567 A | * | 12/1996 | Chen et al. | 714/758 |
| 5,691,994 A | * | 11/1997 | Acosta et al. | 714/784 |
| 6,640,327 B1 | * | 10/2003 | Hallberg | 714/785 |
| 7,603,592 B2 | * | 10/2009 | Sekiguchi et al. | 714/710 |
| 2010/0180182 A1 | * | 7/2010 | Trantham | 714/799 |

* cited by examiner

*Primary Examiner* — Albert Decady
*Assistant Examiner* — Enam Ahmed
(74) *Attorney, Agent, or Firm* — Knobbe Martens Olson & Bear LLP

(57) ABSTRACT

Example embodiments described herein may relate error detection and correction on a portion of a codeword in a memory device.

20 Claims, 6 Drawing Sheets

| Memory Array 200 | | | | | | | | |
|---|---|---|---|---|---|---|---|---|
| Codeword M | Codeword M-1 | Codeword M-2 | Codeword M-3 | . . . | Codeword 204 | Codeword 203 | Codeword 202 | Codeword 201 |

Figure 2

ERROR DETECTION OR CORRECTION OF A PORTION OF A CODEWORD IN A MEMORY DEVICE

BACKGROUND

Subject matter disclosed herein may relate memory devices, and may relate more particularly to error detection and correction of portions of codewords in memory devices.

Memory devices, including non-volatile memory devices such as flash or phase change memory devices, for example, may be found in a wide range of electronic devices. For example, memory devices may be used in computers, digital cameras, cellular telephones, personal digital assistants, etc. Non-volatile memory devices may be incorporated into solid state drives for use with computer systems or other electronic devices, for example. Some memory devices or digital electronic systems may incorporate error detection or correction schemes in an effort to increase reliability. However, such error detection or correction schemes may negatively impact overall system performance due to an increase in overhead resulting from error detection or correction operations.

BRIEF DESCRIPTION OF THE DRAWINGS

Claimed subject matter is particularly pointed out and distinctly claimed in the concluding portion of the specification. However, both as to organization or method of operation, together with objects, features, or advantages thereof, it may best be understood by reference to the following detailed description if read with the accompanying drawings in which:

FIG. 2 is a schematic block diagram depicting an example embodiment of a memory array.

Reference is made in the following detailed description to the accompanying drawings, which form a part hereof, wherein like numerals may designate like parts throughout to indicate corresponding or analogous elements. It will be appreciated that for simplicity or clarity of illustration, elements illustrated in the figures have not necessarily been drawn to scale. For example, the dimensions of some of the elements may be exaggerated relative to other elements for clarity. Further, it is to be understood that other embodiments may be utilized. Furthermore, structural or logical changes may be made without departing from the scope of claimed subject matter. It should also be noted that directions or references, for example, up, down, top, bottom, and so on, may be used to facilitate discussion of the drawings and are not intended to restrict the application of claimed subject matter. Therefore, the following detailed description is not to be taken to limit the scope of claimed subject matter or their equivalents.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, methods, apparatuses or systems that would be known by one of ordinary skill have not been described in detail so as not to obscure claimed subject matter.

As mentioned above, memory devices may be used in a range of electronic devices, such as, for example, computers, digital cameras, cellular telephones, personal digital assistants, etc. Non-volatile memory devices may be incorporated into solid state drives for use with computer systems or other electronic devices, for example. For some memory systems in digital electronic devices, error detection or correction may be utilized to help improve bit error rate (BER) for memory devices in a system. In some systems or memory devices, it may be desirable to apply error detection or correction on relatively large data segments in order to reduce an amount of parity bits or other types of error detection and correction bits for a specified target BER. However, applying error detection or correction to larger data segments may require relatively large amounts of logic circuitry. Larger amounts of logic circuitry may increase manufacturing costs. Also, system performance may be negatively affected due to increased latencies, for example with respect to memory read accesses for large data segments. Example embodiments described herein may provide for error detection or correction operations for a portion of a larger data segment in a memory device without accessing the entire data segment, in at least some circumstances. Example embodiments are described below.

Figure 1:
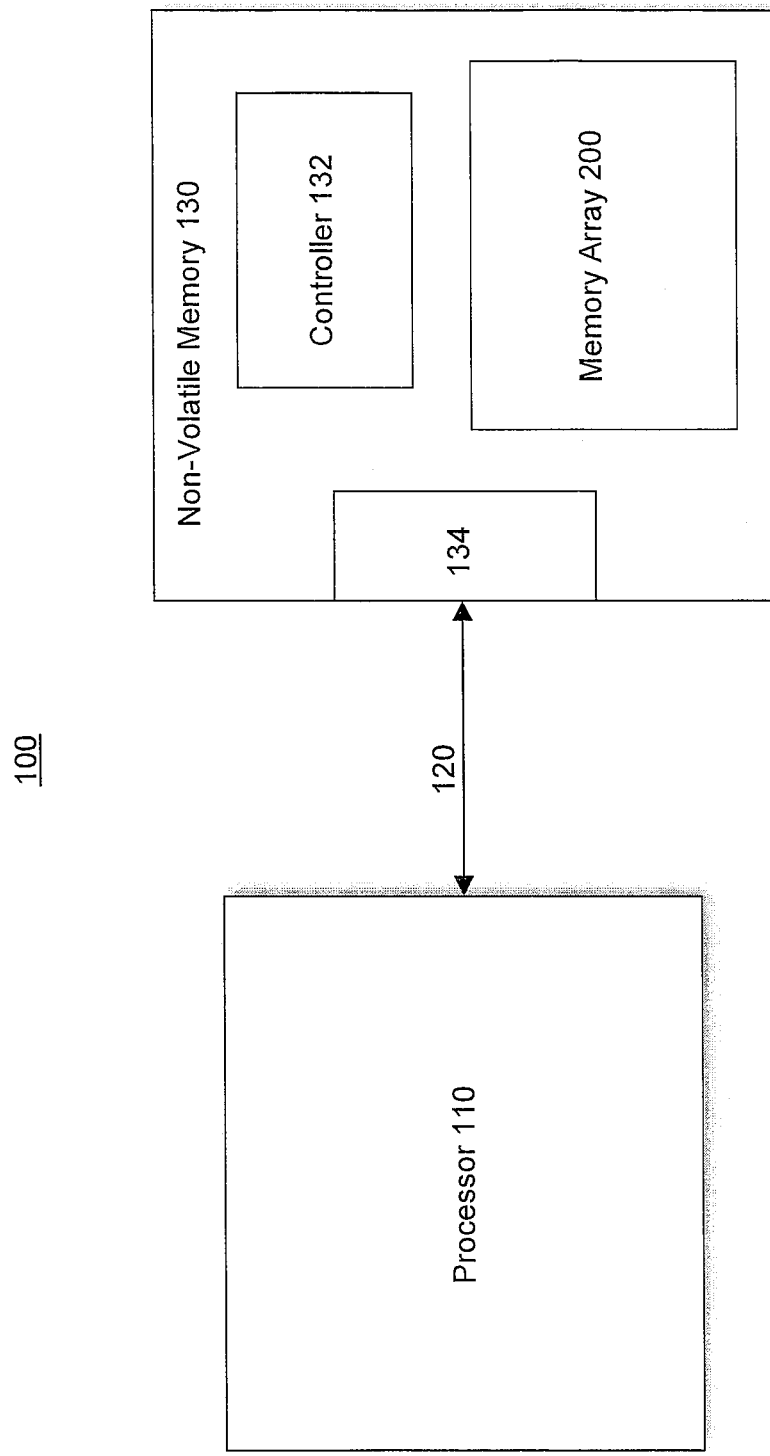
FIG. 1 is a schematic block diagram illustrating an example embodiment of a computing platform.

FIG. 1 is a block diagram of an example embodiment of a computing platform 100, comprising a processor 110 and a non-volatile memory 130. For the present example, non-volatile memory device 130 comprises a phase change memory (PCM) device, although the scope of claimed subject matter is not limited in this respect. Also, although memory device 130 is depicted in FIG. 1 as a non-volatile memory device, the scope of claimed subject matter is not limited in this respect. For example, in an embodiment, a memory device may comprise a dynamic random access memory (DRAM). Memory 130 for this example is coupled to processor 110 by way of an interconnect 120. Interconnect 120 may comprise a parallel interconnect in an embodiment, although the scope of claimed subject matter is not limited in this respect. Memory 130 may also comprise an input/output interface 134 that may be coupled to interconnect 120 and that may provide one or more control, address, or data signals to controller 132. Also for an embodiment, processor 110 may fetch instructions stored in a memory array 200 of non-volatile memory 130 and may execute the fetched instructions. Processor 110 may also program information into memory array 200.

For one or more embodiments, non-volatile memory 130 may comprise a controller 132. Controller 132 may receive one or more control signals or commands from processor 110 and may generate one or more internal control signals to perform any of a number of operations, including data read and/or write operations, by which processor 110 may access data stored in memory array 200. As used herein, the term "data" relates to any type of information that may be stored in a digital format within a memory of an electronic device. Such information may include instruction code that may be executable by a processor, for example. Also, controller 132 may further generate one or more internal control signals to perform error detection or correction operations.

Also, as used herein, the term "codeword" relates to a data segment associated with one or more parity bits. A codeword, in an embodiment, may be partitioned into a number of segments, as described more fully below. A segment of a codeword may be referred to herein as a "sub-codeword". Also, in an embodiment, a sub-codeword may comprise one or more data bits and one or more error correction code bits associated with the one or more data bits.

As discussed more fully below, memory array 200 may comprise a number of codewords, and individual codewords may be partitioned into one or more sub-codewords, as described more fully below. In an embodiment, an error detection or correction scheme implemented in accordance with claimed subject matter may be utilized in an effort to reduce BER. An error detection or correction scheme may be implemented for read and write accesses to memory array 200, in an embodiment. As discussed more fully below, in an embodiment, error detection may be implemented for sub-codewords without accessing a whole codeword. Data may also be written to and/or read from memory array 200 by processor 110. For the example depicted in FIG. 1, the configuration of computing platform 100 may comprise an execute-in-place (XiP) implementation, wherein processor 110 fetches instructions directly from longer-term memory, which, for an embodiment, comprises non-volatile memory device 130.

The term "computing platform" as used herein refers to a system or a device that includes the ability to process or store data in the form of signals. Thus, a computing platform, in this context, may comprise hardware, software, firmware or any combination thereof. Computing platform 100, as depicted in FIG. 1, is merely one such example, and the scope of claimed subject matter is not limited in these respects. For one or more embodiments, a computing platform may comprise any of a wide range of digital electronic devices, including, but not limited to, personal desktop or notebook computers, high-definition televisions, digital versatile disc (DVD) players or recorders, game consoles, satellite television receivers, cellular telephones, personal digital assistants, mobile audio or video playback or recording devices, and so on. Further, unless specifically stated otherwise, a process as described herein, with reference to flow diagrams or otherwise, may also be executed or controlled, in whole or in part, by a computing platform. For the example embodiments described herein, computing platform 100 may comprise a cellular telephone, although again, the scope of claimed subject matter is not so limited.

As mentioned above, for an embodiment, processor 110 may be coupled to non-volatile memory 200 by way of parallel interconnect 120. In another example embodiment, interconnect 120 may comprise a serial interface. Also, although processor 110 is depicted in FIG. 1 as being directly connected to non-volatile memory 130, other embodiments within the scope of claimed subject matter may indirectly couple processor 110 to memory 130. For example, in an embodiment, memory 130 may be coupled to a memory controller, and the memory controller may be coupled, either directly or indirectly, to a processor. However, the scope of claimed subject matter is not limited in this respect.

As previously mentioned, non-volatile memory device 130 may comprise a phase change memory (PCM) device. PCM memory may be characterized, at least in part, by an ability to be electrically erased and programmed, and may be utilized in a very wide range of electronic device types including, but not limited to, digital cameras, cellular telephones, personal digital assistants, portable navigation devices, portable music players, notebook computers, desktop computers, etc., to name but a few examples. In general, PCM memory devices may support accesses to smaller data segments as compared, for example, to NAND flash memory devices. Read access latencies may also be reduced in PCM memory devices as compared to NAND flash memory devices. In one or more embodiments, the aforementioned example characteristics of PCM memory devices may be utilized advantageously in error detection or correction schemes that may provide specified BER with reduced levels of overhead and with improved memory system performance as compared with memory systems based on other non-volatile memory technologies, for example. Although example embodiments described herein may comprise PCM non-volatile memory devices, the scope of claimed subject matter is not limited in this respect and other embodiments may utilize other types of volatile or non-volatile memory devices. For example, one or more embodiments may include dynamic random access memory (DRAM), read-only memory (ROM), flash memory, etc.

FIG. 2 is a schematic block diagram depicting an example embodiment of memory array 200. In an embodiment, memory array 200 may have a capability to store a plurality of codewords, labeled in FIG. 2 as codewords 201-'M'. Codewords 201-'M' may individually comprise 4 k bytes of data, in an embodiment. Example embodiments in accordance with claimed subject matter may comprise one or more memory devices capable of storing one or more codewords. A total amount of codewords that may be stored in a memory device may depend, at least in part, on a total size of the memory device.

Figure 3:
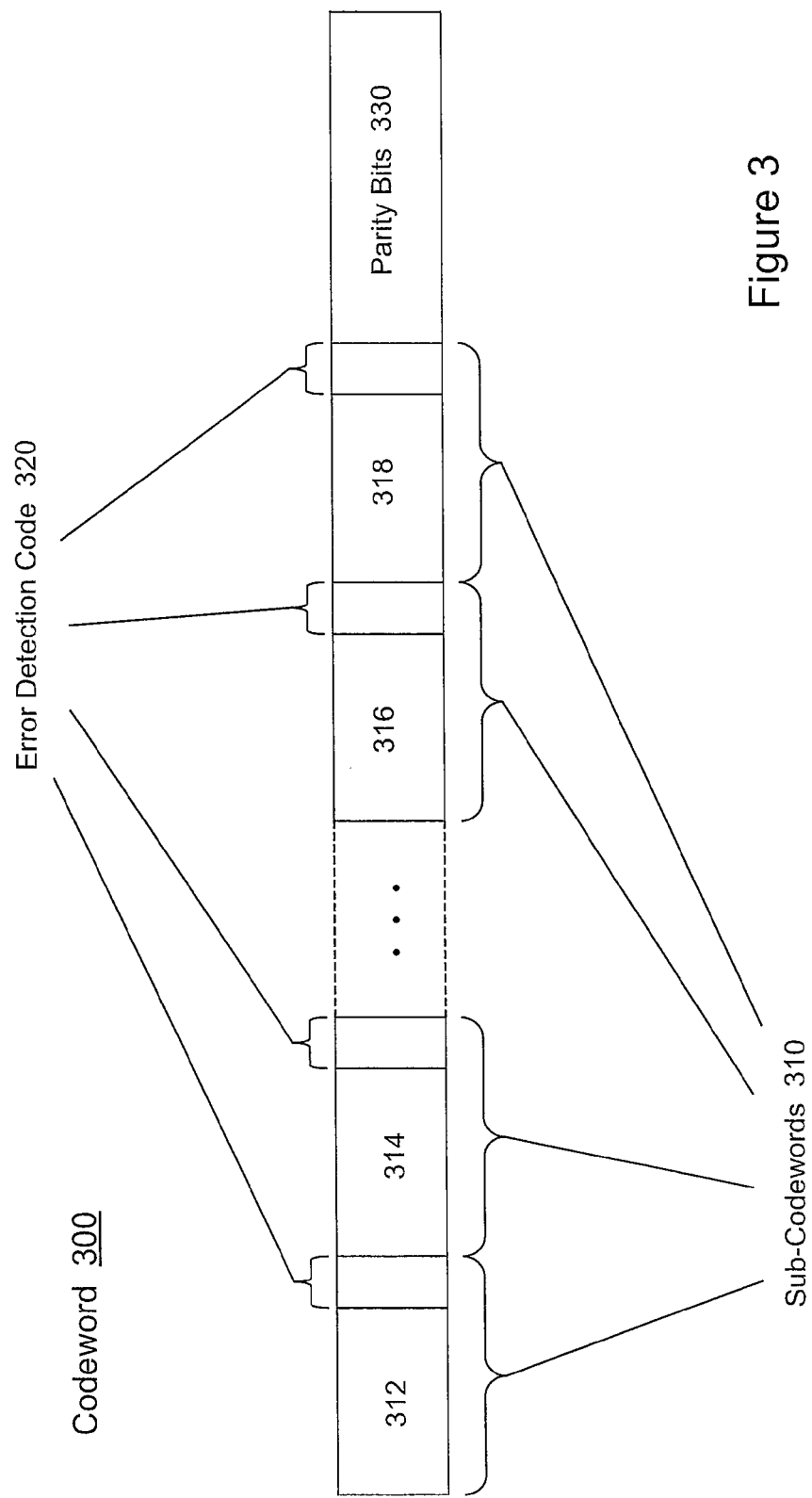
FIG. 3 is a schematic block diagram depicting an example embodiment of a codeword.

FIG. 3 is a schematic block diagram depicting an example embodiment of a codeword 300. In an embodiment, codeword 300 may comprise 4 k bytes of data, although the scope of claimed subject matter is not limited in this respect. Also in an embodiment, codeword 300 may be partitioned into a plurality of sub-codewords, labeled 312-318 for the example depicted in FIG. 3. In an embodiment, sub-codewords 312-318 may individually comprise 64 bytes of data and an error detection code field 320. Error detection code fields 320 for sub-codewords 312-318 may individually comprise one or more bits of information that may be utilized to detect or correct one or more errors in a respective sub-codeword. In an example embodiment, error detection code fields 320 may comprise one or more cyclic redundancy check (CRC) bits that may be utilized to perform cyclic redundancy checks for sub-codewords 312-318. CRC operations may be performed on one or more of sub-codewords 312-318 to detect data errors. In an embodiment, and as described in more detail below, error detection operations may be performed on one or more individual sub-codewords 312-318 without accessing the whole of codeword 300, in at least some circumstances.

For the example embodiment depicted in FIG. 3, codeword 300 may comprise $2^y$ sub-codewords. Sub-codewords 312-318 may individually comprise $2^x$ data bits and z CRC bits. In an embodiment, z may comprise a value of one or more. As previously mentioned, codeword 300 may comprise 4 k data bytes of and individual sub-codewords may comprise 64 data bytes, in an example embodiment. In an embodiment, a sub-codeword size may correspond to a cache line size associated with a cache that may be incorporated into a memory subsystem. Also in an embodiment, a sub-codeword size may represent a smallest granularity of memory that may be accessed in a given system. For a codeword size of 4 k data bytes and a sub-codeword size of 64 data bytes, a codeword may comprise 64 sub-codewords. Of course, claimed subject matter is not limited in these respects. Also, as previously discussed, individual sub-codewords may be associated with one or more error detection bits. Further, in addition to its 4 k data bytes, codeword 300 may comprise a field of parity bits 330 that may be utilized to perform error detection or correction for the whole codeword. In an embodiment, a total size of codeword 300 may be given by a relation:

$$2^{(x+y)} + z(2^y) + p \quad (1)$$

wherein p represents an amount of parity bits in field 330.

Figure 4:
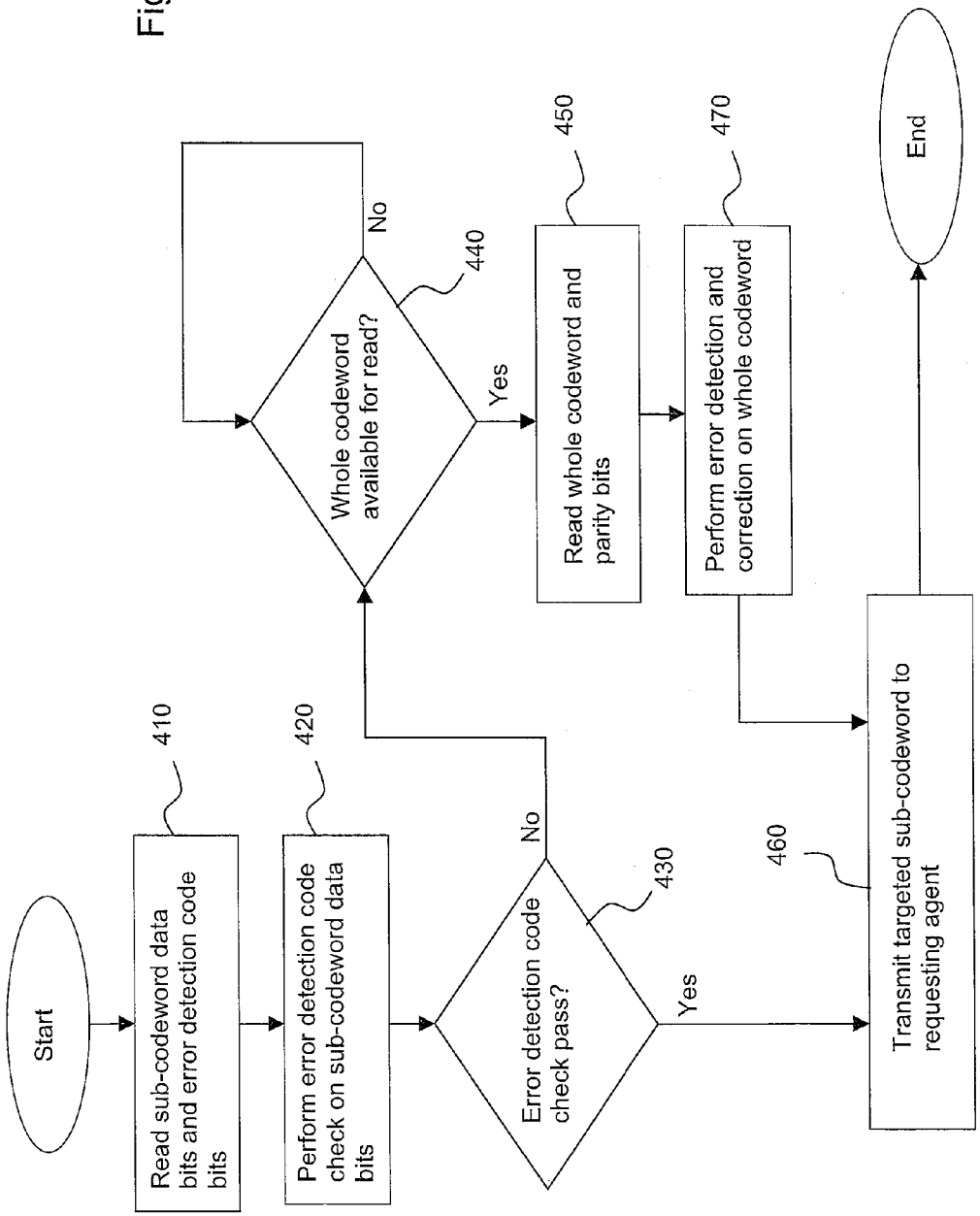
FIG. 4 is a flow diagram depicting an example embodiment of a process for reading a sub-codeword with error detection from a memory array.

FIG. 4 is a flow diagram depicting an example embodiment of a process for reading a sub-codeword from a memory array with error detection. At block 410, a sub-codeword comprising one or more data bits and one or more error detection code bits may be read from a codeword stored in a memory. The read operation may be performed at least in part in response to a read access request from a requesting agent such as, for example, a processor, although the scope of claimed subject matter is not limited in this respect. In an embodiment, a sub-word may comprise 64 bytes of data. Also in an embodiment, error detection code bits may comprise one or more CRC bits. However, the scope of claimed subject matter is not limited in these respects. At block 420, an error detection operation may be performed utilizing the aforementioned one or more error detection code bits. As indicated at block 430, if the error detection code check passes, that is, if no error is detected, the sub-codeword may be transmitted to a requesting agent, as indicated at block 460.

As further indicated at block 430, if the error detection code check does not pass, that is, if an error is detected, a determination may be made as to whether the whole codeword from which the sub-codeword was retrieved is available for a read operation, as indicated at block 440. For example, if one or more sub-codewords are being programmed at a particular point in time, the codeword may not be available for a read access. If, at block 440, the whole codeword is not available for a read access, a waiting period may occur until the codeword becomes available for the read access. At least in part in response to the entire codeword being available for a read access, the codeword and associated parity bits may be read, as indicated at block 450. At block 470, an error detection or correction operation may be performed over the entire codeword, and a corrected sub-codeword that was the target of the initial read request may be transmitted to the requesting agent at block 460.

In general, the example of FIG. 4 depicts an example process whereby a sub-codeword from a larger codeword may be read and an error detection operation may be performed at least in part in response to a read request. If an error is detected, an error detection and correction operation may be performed on the codeword to generate a corrected sub-codeword at least in part in response to a detection of an error for the sub-codeword. If no error is determined for the sub-codeword, the error detection and correction operation for the codeword may not be performed. By accessing and error checking the sub-codeword targeted by the read request, the sub-codeword may be provided to the requesting agent without having to perform error checking on the larger codeword. Because it may be a relatively rare event to detect an error in a sub-codeword, the error detection and correction operation for the codeword may occur relatively infrequently. Reduced memory system overhead may result, and memory system performance may be enhanced. Savings may also be experienced in the amount of circuitry or processing resources needed to perform error detection or correction, and power savings may also result. Also, because error detection and correction for a codeword may occur relatively infrequently in an embodiment, increasingly powerful error detection and correction techniques may be employed without leading to significant degradation in system performance or power consumption, for example.

Embodiments in accordance with claimed subject matter may include all of, more than, or fewer than blocks 410-470. Further, the order of blocks 410-470 is merely an example order, and the scope of claimed subject matter is not limited in this respect.

Figure 5:
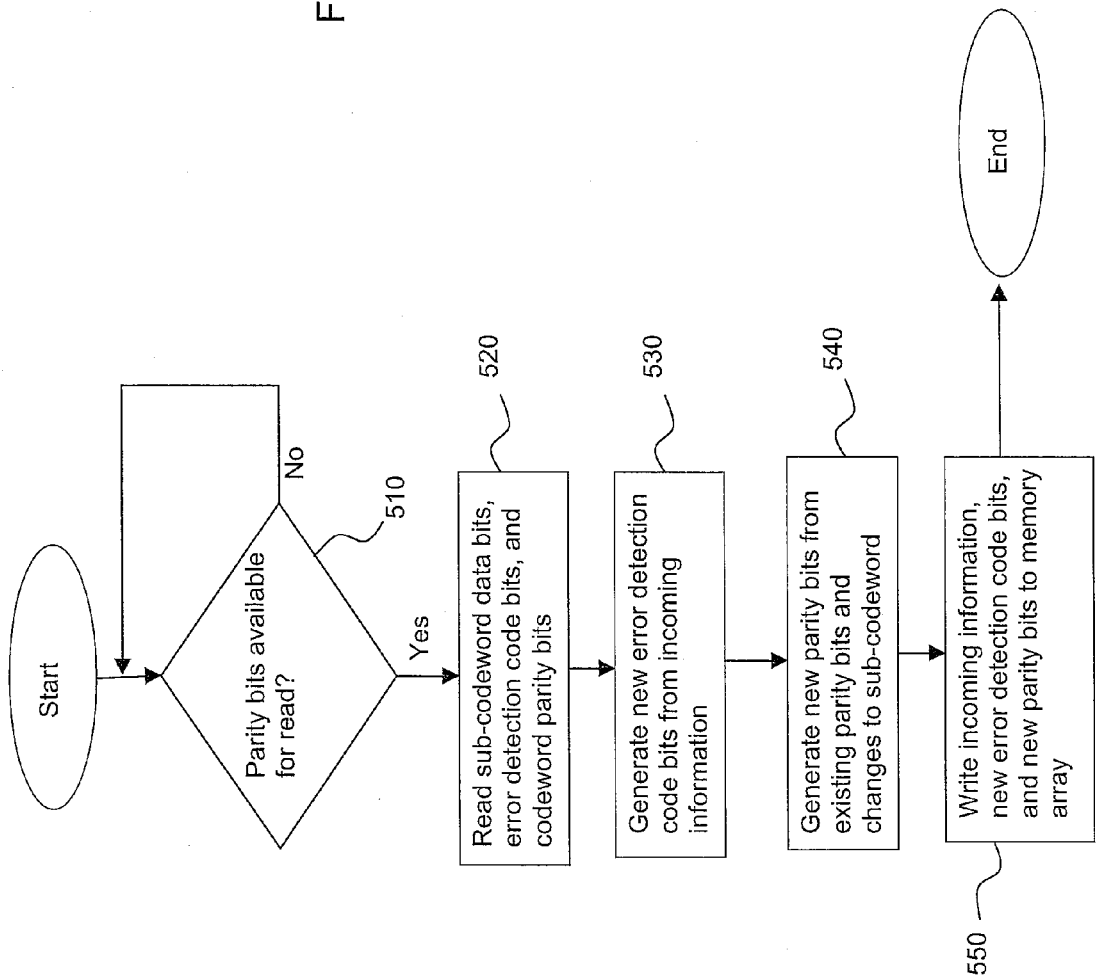
FIG. 5 is a flow diagram illustrating an example embodiment of a process for programming a sub-codeword with error correction code in a memory array.

FIG. 5 is a flow diagram illustrating an example embodiment of a process for programming a sub-codeword with error correction code in a memory array. In an embodiment, to program a sub-codeword, parity bits associated with the sub-codeword's codeword may be updated to reflect the newly programmed data. At least in part in response to a sub-codeword program request, otherwise referred to as a write request, a determination may be made as to whether parity bits associated with a codeword associated with the targeted sub-codeword are available to be read, as indicated at block 510. At least in part in response to the parity bits being available to be read, the sub-codeword data and error detection code bits may be read, as well as the codeword parity bits, as indicated at block 520. At block 530, new error detection code bits for the targeted sub-codeword may be generated based at least in part on incoming information. "Incoming information" refers to information to be programmed into the targeted sub-codeword in accordance with the program request. Further, at block 540, new parity bits associated with the codeword may be generated based at least in part on previously existing parity bits and on changes to the targeted sub-codeword. At block 550, the incoming information and new error detection code bits associated with the targeted sub-codeword may be programmed into a memory array at a location allocated to the sub-codeword. Also, the new parity bits associated with the codeword may also be programmed into the memory array. Embodiments in accordance with claimed subject matter may include all, less than, or more than, blocks 510-550. Also, the order of blocks 510-550 is merely an example order, and the scope of claimed subject matter is not limited in these respects.

Figure 6:
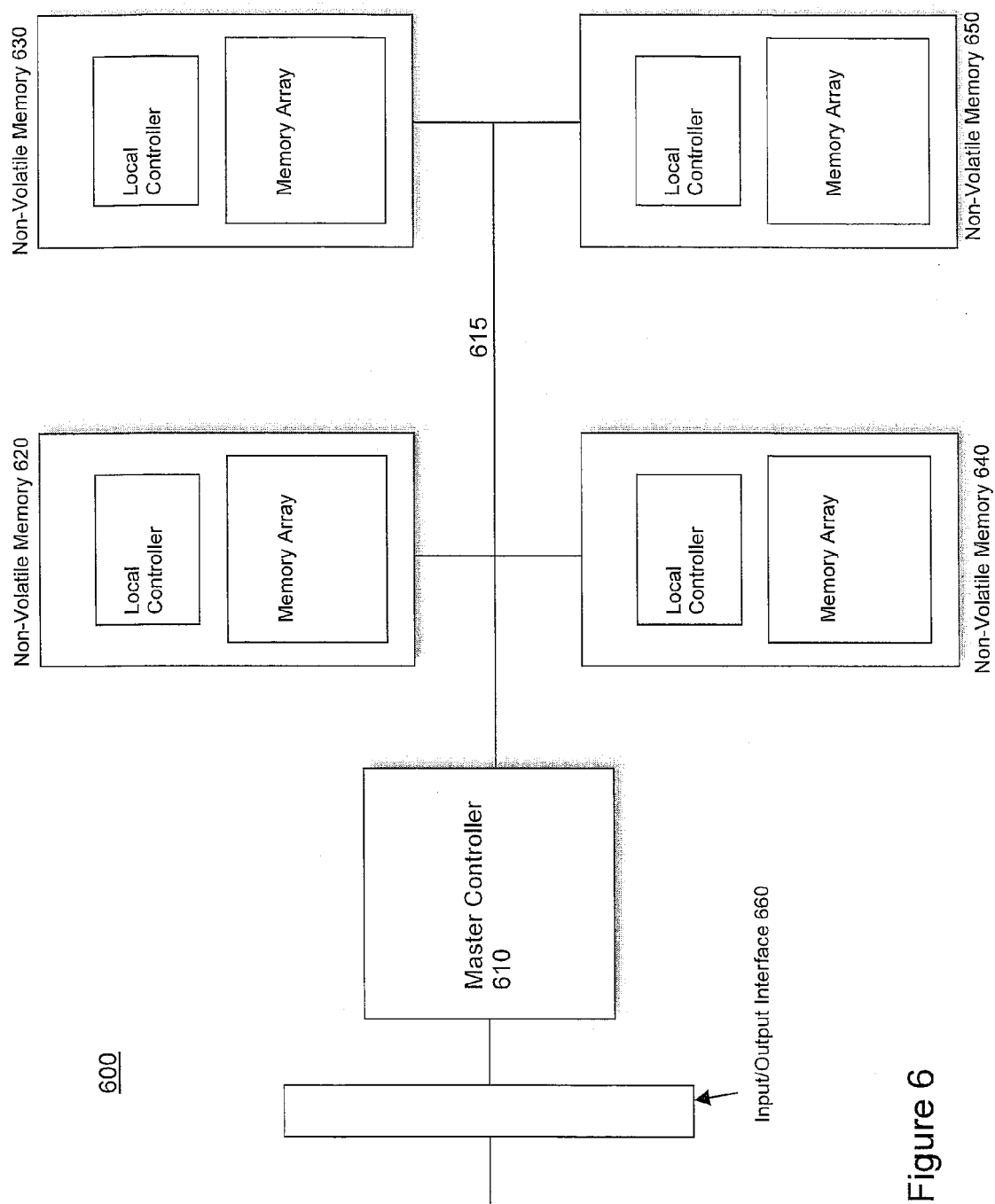
FIG. 6 is a schematic block diagram of an example embodiment of a storage drive.

FIG. 6 is a schematic block diagram of an example embodiment of a system 600. In an embodiment, system 600 may comprise a solid state drive (SSD), for example for use with a computing platform, although the scope of claimed subject matter is not limited in this respect. For the example depicted in FIG. 6, system 600 may comprise a master controller 610 coupled to a number of non-volatile memory devices 620, 630, 640, and 650. The term "master" used in this context refers to a controller that may interact with one or more memory devices and that is located external to the one or more memory devices. By contrast, memory devices 620-650 may individually comprise a local controller. The term "local" used in this context refers to a controller dedicated to functions related to a particular memory device and that is located within the memory device. Memory devices 620-650 may be coupled to master controller 610 via a bus 615. Bus 615 may represent any of a variety of possible technologies available now and in the future that may couple a memory device to a controller.

Non-volatile memory devices 620-650 may further individually comprise a memory array. Memory devices 620-650 may also comprise input/output interfaces (not shown) to couple the memory devices to bus 615. System 600 may also comprise an input/output interface 660 by which system 600 may be temporarily or permanently incorporated into a larger system, in an embodiment. For the example system embodiment 600, non-volatile memory devices 620-650 may comprise PCM memory devices. Memory devices 620-650 may be implemented in accordance to example embodiments described above in connection with FIGS. 1-5. For example, memory devices 620-650 may comprise storage locations allocated to one or more codewords partitioned into one or more sub-codewords. Also, in an embodiment, error detection and correction techniques may be employed for system 600 as a whole. Example error detection or correction embodiments such as those described herein may be utilized to maintain data integrity for system 600.

As mentioned previously, example system embodiment 600 may comprise a solid state drive (SSD). An SSD may have a capability to store relatively large amounts of data. By utilizing example embodiments for error detection or correction described above, a specified BER may be maintained while improvements in performance and power consumption may be realized at least in part by performing error detection on sub-codewords and performing error detection or correction on codewords relatively infrequently if a sub-codeword data error is detected. System cost may also be reduced due to a potential reduction in circuitry or processing resources dedicated to performing error detection or correction.

Reference throughout this specification to "one embodiment" or "an embodiment" may mean that a particular feature, structure, or characteristic described in connection with a particular embodiment may be included in at least one embodiment of claimed subject matter. Thus, appearances of the phrase "in one embodiment" or "an embodiment" in various places throughout this specification are not necessarily intended to refer to the same embodiment or to any one particular embodiment described. Furthermore, it is to be understood that particular features, structures, or characteristics described may be combined in various ways in one or more embodiments. In general, of course, these and other issues may vary with the particular context of usage. Therefore, the particular context of the description or the usage of these terms may provide helpful guidance regarding inferences to be drawn for that context.

Likewise, the terms, "and" and "or" as used herein may include a variety of meanings that also is expected to depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, or characteristic in the singular or may be used to describe some combination of features, structures or characteristics. Though, it should be noted that this is merely an illustrative example and claimed subject matter is not limited to this example.

Some portions of the detailed description included herein are presented in terms of algorithms or symbolic representations of operations on binary digital signals stored within a memory of a specific apparatus or special purpose computing device or platform. In the context of this particular specification, the term specific apparatus or the like includes a general purpose computer once it is programmed to perform particular operations pursuant to instructions from program software. Algorithmic descriptions or symbolic representations are examples of techniques used by those of ordinary skill in the signal processing or related arts to convey the substance of their work to others skilled in the art. An algorithm is here, and generally, is considered to be a self-consistent sequence of operations or similar signal processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals, or the like. It should be understood, however, that all of these or similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a specific apparatus, such as a special purpose computer or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

In the preceding description, various aspects of claimed subject matter have been described. For purposes of explanation, systems or configurations were set forth to provide an understanding of claimed subject matter. However, claimed subject matter may be practiced without those specific details. In other instances, well-known features were omitted or simplified so as not to obscure claimed subject matter. While certain features have been illustrated or described herein, many modifications, substitutions, changes or equivalents will now occur to those skilled in the art. It is, therefore, to be understood that the appended claims are intended to cover all such modifications or changes as fall within the true spirit of claimed subject matter.

The invention claimed is:

1. A method of retrieving data, the method comprising:
   performing an error detection operation on a sub-codeword of a plurality of sub-codewords of a codeword stored in a memory array at least in part in response to a read access request;
   performing an error detection and correction operation on the codeword at least in part in response to a detection of an error for the sub-codeword to generate a corrected sub-codeword;
   receiving a program command to write incoming information to a storage location in the memory array of a second sub-codeword of the plurality of sub-codewords;
   reading the second sub-codeword and said one or more parity bits, wherein said second sub-codeword comprises one or more data bits and one or more cyclic redundancy check bits;
   generating new cyclic redundancy check bits for the second sub-codeword based at least in part on the incoming information;
   generating one or more new parity bits for the codeword based at least in part on the previous one or more parity bits and on the incoming information; and
   writing the incoming information and the new cyclic redundancy check bits to the storage location in the memory array of the second sub-codeword, and replacing the previous one or more parity bits with the new one or more parity bits.

2. The method of claim 1,
   wherein the error detection operation is performed without accessing the whole of the codeword.

3. The method of claim 1, further comprising providing the sub-codeword to an input/output interface at least in part in response to a non-detection of an error for the sub-codeword.

4. The method of claim 1, further comprising providing the corrected sub-codeword to an input/output interface to satisfy the read access request.

5. The method of claim 1, wherein said performing the error detection and correction operation comprises waiting until the entire codeword is available for reading prior to performing the error detection and correction operation on the codeword.

6. The method of claim 5, wherein said performing the error detection operation on the sub-codeword comprises performing a cyclic redundancy check of the sub-codeword, wherein the sub-codeword comprises one or more data bits and one or more cyclic redundancy check bits.

7. The method of claim 6, wherein said codeword further comprises one or more parity bits, and wherein said performing said error detection and correction operation on the codeword comprises basing said error detection and correction at least in part on respective states of said one or more parity bits.

8. A memory device, comprising:
a memory array configured to store a codeword comprising one or more sub-codewords; and
a controller configured to perform an error detection operation on a sub-codeword of the one or more sub-codewords at least in part in response to a read access request, the controller further configured to:
perform an error detection and correction operation on the codeword at least in part in response to a detection of an error for the sub-codeword to generate a corrected sub-codeword;
write incoming information received at the input/output interface to a storage location in the memory array of a second sub-codeword of the plurality of sub-codewords at least in part in response to a program command;
read the second sub-codeword and said one or more parity bits, wherein said second sub-codeword comprises one or more data bits and one or more cyclic redundancy check bits;
generate new cyclic redundancy check bits for the second sub-codeword based at least in part on the incoming information;
generate one or more new parity bits for the codeword based at least in part on the previous one or more parity bits and on the incoming information;
write the incoming information and the new cyclic redundancy check bits to the storage location in the memory array for the second sub-codeword; and
replace the previous one or more parity bits with the new one or more parity bits.

9. The memory device of claim 8,
wherein the error detection operation is performed without accessing the whole of the codeword.

10. The memory device of claim 8, further comprising an input/output interface to transmit the corrected sub-codeword to fulfill the read access request.

11. The memory device of claim 8, the controller to perform the error detection and correction operation at least in part by waiting until the entire codeword is available for reading prior to performing the error detection and correction operation on the codeword.

12. The memory device of claim 11, the controller further to perform the error detection operation on the sub-codeword at least in part by performing a cyclic redundancy check of the sub-codeword, wherein the sub-codeword comprises one or more data bits and one or more cyclic redundancy check bits.

13. The memory device of claim 12, wherein said codeword further comprises one or more parity bits, the controller further to perform said error detection and correction operation on the codeword by basing said error detection and correction at least in part on respective states of said one or more parity bits.

14. A system, comprising:
a master controller; and
one or more non-volatile memory devices coupled to the master controller, wherein the one or more non-volatile memory devices individually comprise:
a memory array configured to store a codeword comprising one or more sub-codewords; and
a local controller configured to perform an error detection operation on a sub-codeword of the one or more sub-codewords at least in part in response to a read access request, the local controller further configured to:
perform an error detection and correction operation on the codeword at least in part in response to a detection of an error for the sub-codeword to generate a corrected sub-codeword;
write incoming information received at the input/output interface to a storage location in the memory array of a second sub-codeword of the plurality of sub-codewords at least in part in response to a program command;
read the second sub-codeword and said one or more parity bits, wherein said second sub-codeword comprises one or more data bits and one or more cyclic redundancy check bits;
generate new cyclic redundancy check bits for the second sub-codeword based at least in part on the incoming information;
generate one or more new parity bits for the codeword based at least in part on the previous one or more parity bits and on the incoming information;
write the incoming information and the new cyclic redundancy check bits to the storage location in the memory array for the second sub-codeword; and
replace the previous one or more parity bits with the new one or more parity bits.

15. The system of claim 14,
wherein the error detection operation is performed without accessing the whole of the codeword.

16. The system of claim 14, said one or more of the plurality of non-volatile memory devices individually further comprising an input/output interface to transmit the corrected sub-codeword to the master controller to fulfill the read access request.

17. The system of claim 14, the local controller to perform the error detection and correction operation at least in part by waiting until the entire codeword is available for reading prior to performing the error detection and correction operation on the codeword.

18. The system of claim 17, the local controller further to perform the error detection operation on the sub-codeword at least in part by performing a cyclic redundancy check of the sub-codeword, wherein the sub-codeword comprises one or more data bits and one or more cyclic redundancy check bits.

19. The system of claim 18, wherein said codeword further comprises one or more parity bits, the local controller further to perform said error detection and correction operation on the codeword by basing said error detection and correction at least in part on respective states of said one or more parity bits.

20. The system of claim 14, wherein the system comprises a solid state drive.

* * * * *